(12) United States Patent
Lee et al.

(10) Patent No.: US 9,385,347 B2
(45) Date of Patent: Jul. 5, 2016

(54) OPTICAL MASK

(71) Applicant: Samsung Display Co., Ltd., Yongin (KR)

(72) Inventors: Joon Gu Lee, Seoul (KR); Yeon Hwa Lee, Yongin (KR); Jin Baek Choi, Anyang-si (KR); Young Gil Kwon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/668,587

(22) Filed: Mar. 25, 2015

(65) Prior Publication Data

US 2016/0064698 A1 Mar. 3, 2016

(30) Foreign Application Priority Data

Sep. 3, 2014 (KR) ........................ 10-2014-0117017

(51) Int. Cl.
*B41M 5/40* (2006.01)
*H01L 51/56* (2006.01)
*C23C 14/04* (2006.01)
*B41M 5/48* (2006.01)
*B41M 5/42* (2006.01)
*B41M 5/46* (2006.01)
*H01L 51/00* (2006.01)

(52) U.S. Cl.
CPC ................ *H01L 51/56* (2013.01); *B41M 5/40* (2013.01); *B41M 5/42* (2013.01); *B41M 5/426* (2013.01); *B41M 5/46* (2013.01); *B41M 5/48* (2013.01); *C23C 14/042* (2013.01); *H01L 51/0013* (2013.01)

(58) Field of Classification Search
CPC ........... G03F 1/50; G03F 1/52; C23C 14/042; H01L 51/56; H01L 51/0013; B41M 5/46; B41M 5/48; B41M 5/40; B41M 5/42; B41M 5/426
USPC .............................................. 430/5, 200, 201
See application file for complete search history.

(56) References Cited

U.S. PATENT DOCUMENTS

| 8,093,612 | B2 | 1/2012 | Tanaka |
| 2009/0104835 | A1 | 4/2009 | Aoyama et al. |
| 2009/0166563 | A1* | 7/2009 | Yokoyama .......... H01L 51/0013 250/492.1 |

(Continued)

FOREIGN PATENT DOCUMENTS

| JP | 2012-094500 | 5/2012 |
| KR | 10-2009-0041314 | 4/2009 |
| KR | 10-2009-0041347 | 4/2009 |

*Primary Examiner* — John A McPherson
(74) *Attorney, Agent, or Firm* — H.C. Park & Associates, PLC

(57) ABSTRACT

An optical mask includes a light-to-heat conversion layer with an improved temperature profile. The optical masks may comprise a light-transmitting base substrate; a first reflective pattern layer which is formed on the light-transmitting base substrate comprising a first opening portion transmitting light emitted from under the light-transmitting base substrate and a first reflective portion reflecting the light; a second reflective pattern layer which is formed over the first opening portion comprising a second opening portion overlapping a first area of the first opening portion and a second reflective portion overlapping a second area of the first opening portion; and a light-to-heat conversion pattern layer which is formed on the light-transmitting base substrate, being disposed in the first area of the first opening portion, absorbing at least a part of the light, and converting the light absorbed into heat.

20 Claims, 5 Drawing Sheets

(56) References Cited

U.S. PATENT DOCUMENTS

| | | | |
|---|---|---|---|
| 2009/0220706 A1* | 9/2009 | Yamazaki | C23C 14/28 427/596 |
| 2009/0266479 A1* | 10/2009 | Chung | B32B 33/00 156/247 |
| 2015/0340615 A1* | 11/2015 | Kang | H01L 51/0013 257/40 |

* cited by examiner

OPTICAL MASK

CROSS-REFERENCE TO RELATED APPLICATION

This application claims priority from and the benefit of Korean Patent Application No. 10-2014-0117017, filed on Sep. 3, 2014, which is hereby incorporated by reference for all purposes as if fully set forth herein.

BACKGROUND

1. Field

Exemplary embodiments relate to an optical mask. More particularly, exemplary embodiments relate to an optical mask including a light-transmitting base substrate; a first reflective pattern layer which is formed on the light-transmitting base substrate and includes a first opening portion transmitting light emitted from under the light-transmitting base substrate and a first reflective portion reflecting the light; and a second reflective pattern layer which is formed over the first reflective pattern layer.

2. Discussion of the Background

Generally, an organic electroluminescent device includes an anode, a cathode and organic layers interposed between the anode and the cathode. The organic layers include at least an organic light-emitting layer and may further include a hole injection layer, a hole transport layer, an electron transport layer and an electron injection layer. The organic electroluminescent device is classified as a polymer organic electroluminescent device or a low molecular weight organic electroluminescent device according to the material that forms the organic light-emitting layer.

To implement a full-color organic electroluminescent device, the organic light-emitting layer should be patterned. An organic light-emitting layer in a low molecular weight organic electroluminescent device may be patterned using a fine metal mask, and an organic light-emitting layer in a polymer organic electroluminescent device may be patterned using an inkjet printing method or a laser induced thermal imaging (LITI) method.

In particular, the LITI method has the advantage of finely patterning the above organic layer. Also, the LITI method is a dry process, whereas the inkjet printing method is a wet process.

Forming a polymer organic layer pattern using the LITI method requires at least a light source and organic electroluminescent device substrates, i.e., a device substrate (or a target substrate) and a transfer substrate. The transfer substrate consists of a base film, a light-to-heat conversion layer, and a transfer layer composed of one or more organic layers.

The organic layers of the transfer substrate may be transferred to the device substrate as described hereinafter: Light emitted from the light source is absorbed; The light is converted into thermal energy by the light-to-heat conversion layer of the transfer substrate; The organic layers of the transfer substrate are evaporated by the thermal energy; The organic layer is transferred onto the device substrate from the transfer substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an optical mask including a light-to-heat conversion layer with an improved temperature profile.

Additional aspects will be set forth in the detailed description which follows, and, in part, will be apparent from the disclosure, or may be learned by practice of the inventive concept.

According to exemplary embodiments, there may be provided an optical mask comprising: a light-transmitting base substrate; a first reflective pattern layer which is formed on the light-transmitting base substrate comprising a first opening portion transmitting light emitted from under the light-transmitting base substrate and a first reflective portion reflecting the light; a second reflective pattern layer which is formed over the first opening portion comprising a second opening portion overlapping a first area of the first opening portion and a second reflective portion overlapping a second area of the first opening portion; and a light-to-heat conversion pattern layer which is formed on the light-transmitting base substrate, being disposed in the first area of the first opening portion, absorbing incident light, and converting the absorbed light into heat.

The second reflective portion may be shaped like a curved surface extending in a downward direction from an end of the second opening portion to the first opening portion, and all or part of light incident upon the curved surface enters an edge area of the light-to-heat conversion layer.

The second reflective portion may be shaped like a curved surface having a variable curvature.

The second reflective portion may extend to an area overlapping the first reflective portion.

The optical mask may further comprise a light-transmitting buffer layer which fills a space between the light-transmitting base substrate and the second reflective portion.

The optical mask may further comprise a light-transmitting buffer layer which is disposed between the first reflective pattern layer and the light-to-heat conversion pattern layer and covers the first reflective portion and the first opening portion.

The second reflective portion may be shaped like a curved surface extending in a downward direction from an end of the second opening portion to the first opening portion, and all or part of light incident upon the curved surface enters an edge area of the light-to-heat conversion pattern layer.

The second reflective portion may be shaped like a curved surface having a variable curvature.

The second reflective portion may extend to an area overlapping the first reflective portion.

The optical mask may further comprise a light-transmitting buffer layer which fills a space between the light-transmitting base substrate and the second reflective portion.

The second reflective portion may be made of one material selected from the group consisting of aluminum(Al), gold (Au), silver(Ag), platinum(Pt), copper(Cu), an aluminum-containing alloy, a silver-containing alloy, and indium oxide-tin oxide.

According to another embodiment of the present invention, there may be provided an optical mask comprising: a light-transmitting base substrate; a first reflective pattern layer which is formed on the light-transmitting base substrate comprising a first opening portion transmitting light emitted from under the light-transmitting base substrate and a first reflective portion reflecting the light; a second reflective pattern layer which is comprised of a dome-structured second reflective portion formed over the first opening portion to cover the first opening portion; and a light-to-heat conversion pattern layer which is formed on the light-transmitting base substrate, being disposed in a first area of the first opening portion, absorbing incident light, and converting the absorbed light into heat.

The second reflective portion may have a hemispherical dome structure, reflecting a part of the light incident upon a curved surface to the light-to-heat conversion pattern layer and transmitting a part of the light.

The second reflective portion may extend to an area overlapping the first reflective portion.

The optical mask may further comprise a light-transmitting buffer layer which fills a space between the light-transmitting base substrate and the second reflective portion.

The optical mask may further comprise a light-transmitting buffer layer which is disposed between the first reflective pattern layer and the light-to-heat conversion pattern layer and covers the first reflective portion and the first opening portion.

The second reflective portion has a hemispherical dome structure, reflecting a part of the light incident upon the curved surface to the light-to-heat conversion pattern layer and transmitting a part of the light.

The second reflective portion may extend to an area overlapping the first reflective portion.

The optical mask may further comprise a light-transmitting buffer layer which fills a space between the light-transmitting base substrate and the second reflective portion.

Embodiments of the present invention provide at least one of the following advantages.

In optical masks according to embodiments of the present invention, a second reflective pattern layer is formed over a first reflective pattern layer in a direction in which light proceeds. Therefore, light passing by a light-to-heat conversion pattern layer is reflected by the second reflective pattern layer to an edge area of the light-to-heat conversion pattern layer, thus making the temperature distribution in the light-to-heat conversion pattern layer uniform. Accordingly, while the temperature distribution in a light-to-heat conversion pattern layer has a Gaussian profile in the absence of the second reflective pattern layer, the temperature distribution in the light-to-heat conversion pattern layer of the optical masks having the second reflective pattern layer according to the embodiments of the present invention may show a profile without a Gaussian tail.

This temperature distribution in the light-to-heat conversion pattern layer may also cause the transfer profile of an organic layer formed on the light-to-heat conversion pattern layer or the transfer profile of an organic layer formed on the second reflective pattern layer composed of a dome-structured second reflective portion to become the profile without the Gaussian tail.

Therefore, the optical masks according to the embodiments of the present invention can improve the uniformity of transfer patterns by making the temperature distribution in the light-to-heat conversion pattern layer uniform.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED INVENTION

Figure 1:
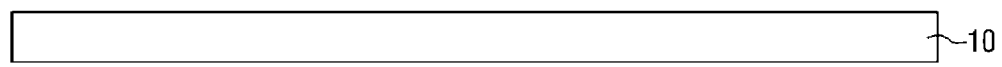
FIGS. 1 through 8 illustrate a process of manufacturing an optical mask according to a first embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1 through 8 illustrate a process of manufacturing an optical mask according to a first embodiment of the present invention.

FIG. 1 illustrates a process of preparing a light-transmitting base substrate 10.

The light-transmitting base substrate 10 may be a light-transmitting substrate that can transmit light emitted from a flash lamp, light emitted from a tungsten halogen lamp, or a laser beam. The light-transmitting base substrate 10 may be a flat substrate.

The light-transmitting base substrate 10 is not limited to a particular substrate as long as it has a light-transmitting property. However, the light-transmitting base substrate 10 may be one of a glass substrate, a quartz substrate, and a synthetic resin substrate made of a transparent polymer material having a superior light-transmitting property, such as polyester, polyacryl, polyepoxy, polyethylene, polystyrene or polyethylene terephthalate.

Figure 9:
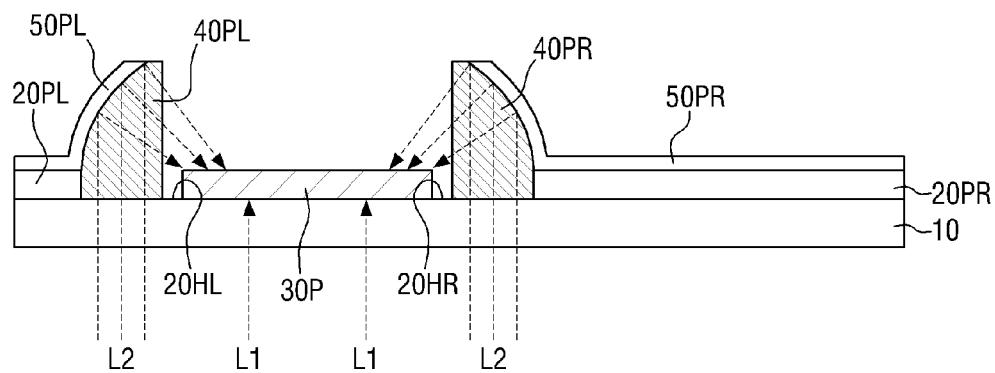
FIG. 9 illustrates the path of light in the optical mask according to the first embodiment of the present invention.

Referring to FIG. 9, light (L1 of FIG. 9) emitted from a light source may pass through the light-transmitting base substrate 10 to reach a light-to-heat conversion pattern layer 30P.

The light source may be a laser, a flash lamp, or a tungsten halogen lamp. The light source is disposed under the light-transmitting base substrate 10. The reflective pattern layer may be formed on a surface of the light-transmitting base substrate 10.

Figure 2:
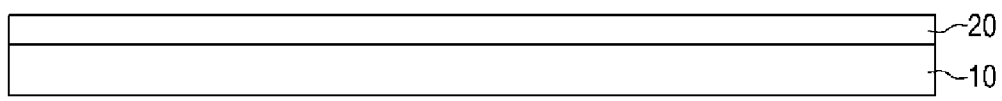

FIG. 2 illustrates a process of forming a first reflective layer 20 on the surface of the light-transmitting base substrate 10.

The first reflective layer 20 may be made of a material having high reflectivity for light emitted from the light source. The first reflective layer 20 may be a flat reflective layer.

For example, the first reflective layer 20 may be made of one material selected from the group consisting of aluminum (Al), gold (Au), silver (Ag), platinum (Pt), an aluminum-containing alloy, a silver-containing alloy, and indium oxide-tin oxide.

The first reflective layer 20 may be formed on the entire surface of the light-transmitting base substrate 10. The first reflective layer 20 may be formed by using various methods including sputtering, electron-beam deposition, and vacuum deposition.

Figure 3:
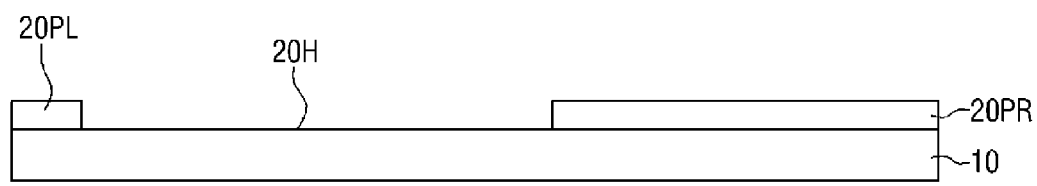

FIG. 3 illustrates a process of forming a first reflective pattern layer (20PL, 20PR, 20H) by partially removing the first reflective layer 20 of FIG. 2.

The first reflective pattern layer (20PL, 20PR, 20H) may include first reflective portions 20PL and 20PR which reflect light emitted from the light source and a first opening portion 20H which transmits light emitted from the light source.

The first reflective portions 20PL and 20PR which reflect light emitted from the light source may be made of the same material as the first reflective layer 20. The first reflective portions 20PL and 20PR may be flat reflective portions.

The first opening portion 20H is an area between the reflective portions 20PL and 20PR and exposes the light-transmitting base substrate 10. That is, the first opening portion 20H may serve as a transmitting window that transmits light emitted from the light source.

An area created by partially removing the first reflective layer 20 corresponds to the first opening portion 20H, and the first reflective portions 20PL and 20PR are disposed on both sides of the first opening portion 20H. The first reflective portion 20PL is formed on a left side of the first opening portion 20H in the drawing, and the first reflective portion 20PR is formed on a right side of the first opening 20H in the drawing.

Figure 4:
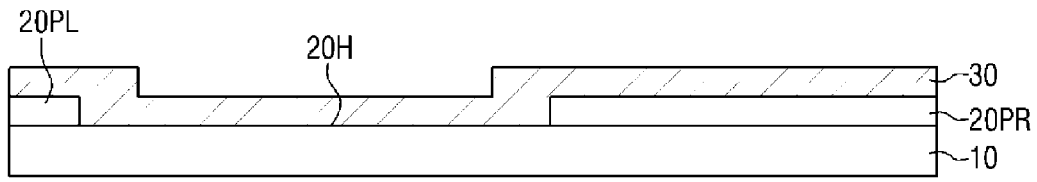

FIG. 4 illustrates a process of forming a light-to-heat conversion layer 30 on the first reflective portions 20PL and 20PR and the surface of the light-transmitting base substrate 10 exposed through the first opening portion 20H.

The light-to-heat conversion layer 30 absorbs infrared and visible light that pass through the light-transmitting base substrate 10 and converts the absorbed light into thermal energy.

The light-to-heat conversion layer 30 may be made of a metal material having high absorptance such as molybdenum (Mo), chrome (Cr), titanium (Ti), tin (Sn), tungsten (W), or any alloy of the same. For example, when a laser beam having a wavelength of approximately 800 nm is to be irradiated, the light-to-heat conversion layer 30 may be made of a metal having low reflectivity and a high melting point, such as Cr or Mo. However, the present invention is not limited thereto.

The light-to-heat conversion layer 30 may be formed by using various methods including sputtering, electron-beam deposition, and vacuum deposition.

Figure 5:
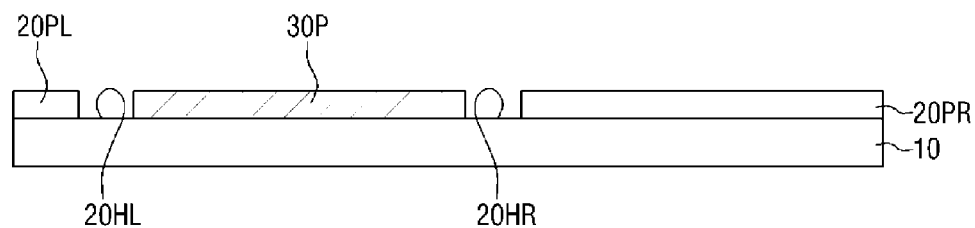

FIG. 5 illustrates a process of forming a light-to-heat conversion pattern layer 30P by partially removing the light-to-heat conversion layer 30.

The light-to-heat conversion pattern layer 30P may be formed on the surface of the light-transmitting base substrate 10 in the area between the first reflective portions 20PL and 20PR. That is, the light-to-heat conversion pattern layer 30P may be formed on the surface of the light-transmitting base substrate 10 in the first opening portion 20H.

The first opening portion 20H may include a first area and a second area. The light-to-heat conversion pattern layer 30P may be disposed in the first area of the first opening portion 20H. That is, the first area is an area in which the light-to-heat conversion pattern layer 30P is disposed. The second area is an area in which the light-to-heat conversion pattern layer 30P is not disposed. In the second area, the light-transmitting base substrate 10 may still be exposed through the remaining first opening portions 20HL and 20HR. Referring to FIG. 5, the remaining first opening portion 20HL belongs to a part of the second area on the left side of the first area, and the remaining first opening portion 20HR belongs to another part of the second area on the right side of the first area.

Figure 6:
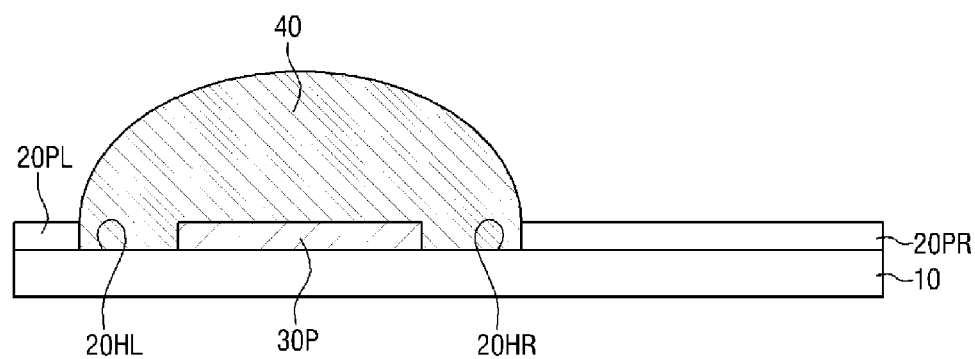

FIG. 6 illustrates a process of forming a first light-transmitting buffer layer 40 on the surface of the light-transmitting base substrate 10 exposed through the remaining first opening portions 20HL and 20HR and a surface of the light-to-heat conversion pattern layer 30P.

The first light-transmitting buffer layer 40 may have a dome structure with convex side and top surfaces. The first light-transmitting buffer layer 40 may be formed to have a dome structure with the bottom of the dome structure in direct contact with the surface of the light-transmitting base substrate 10 exposed through the remaining first opening portions 20HL and 20HR and the surface of the light-to-heat conversion pattern layer 30P. The first light-transmitting buffer layer 40 may cover both the surface of the light-transmitting base substrate 10 and the surface of the light-to-heat conversion pattern layer 30P. In addition, the first light-transmitting buffer layer 40 may not cover surfaces of the first reflective portions 20PL and 20PR. That is, the first light-transmitting buffer layer 40 may be formed to have a dome structure in an area overlapping the first opening portion 20H (see FIG. 3), but the present invention is not limited thereto.

The first light-transmitting buffer layer 40 may be made of a material that can transmit light emitted from the light source. For example, the first light-transmitting buffer layer 40 may have a light transmittance of 80% or more. The first light-transmitting buffer layer 40 may be manufactured by using various methods including inkjet printing, imprinting, and photo-patterning.

Figure 7:
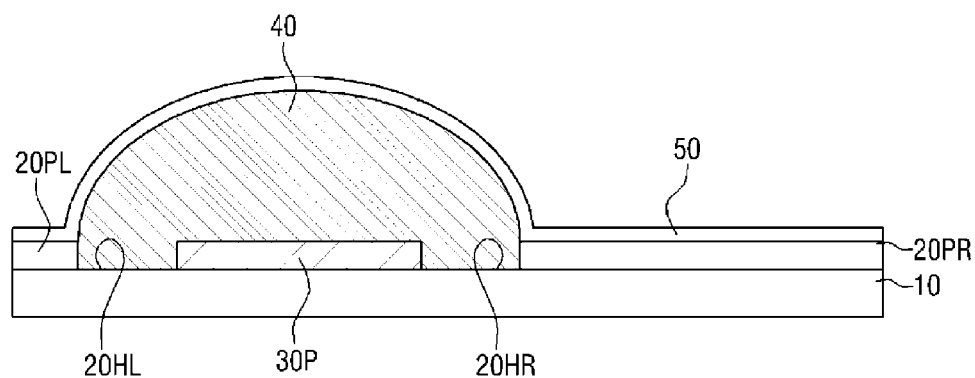

FIG. 7 illustrates a process of forming a second reflective layer 50 on a surface of the first light-transmitting buffer layer 40.

The second reflective layer 50 may be made of a material having high reflectivity for light emitted from the light source. For example, the second reflective layer 50 may be made of one material selected from the group consisting of aluminum (Al), gold (Au), silver (Ag), platinum (Pt), copper (Cu), an aluminum-containing alloy, a silver-containing alloy, and indium oxide-tin oxide.

The second reflective layer 50 may be formed on the entire surface of the light-transmitting base substrate 10. The second reflective layer 50 may be formed by using various methods including sputtering, electron-beam deposition, and vacuum deposition.

In FIG. 7, the second reflective layer 50 is formed on the curved side and top surfaces of the dome structure of the first light-transmitting buffer layer 40 and the surfaces of the first reflective portions 20PL and 20PR. However, the present invention is not limited thereto, and the first light-transmitting buffer layer 40 formed on the surfaces of the first reflective portions 20PL and 20PR can be removed. That is, the second reflective layer 50 may be formed only on the curved side and top surfaces of the first light-transmitting buffer layer 40.

Figure 8:
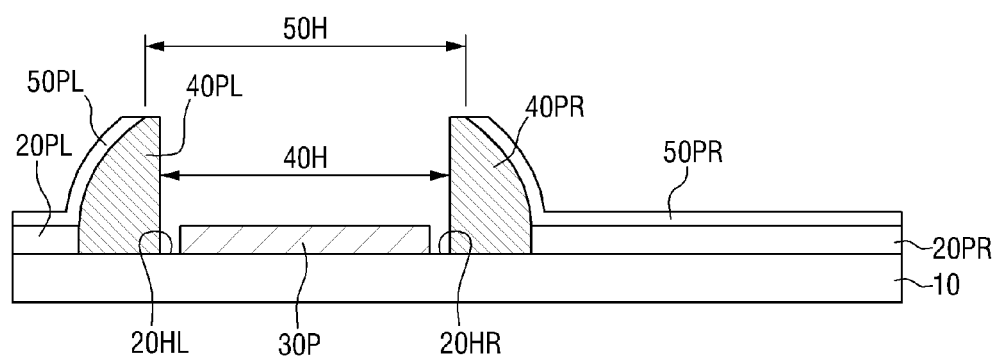

FIG. 8 illustrates a process of forming first light-transmitting buffer pattern layers (40PL, 40PR, 40H) and a second reflective pattern layer (50PL, 50PR, 50H) by partially removing the first light-transmitting buffer layer 40 and the second reflective layer 50.

Referring to FIG. 8, the second reflective pattern layer (50PL, 50PR, 50H) may include second reflective portions 50PL and 50PR and a second opening portion 50H. The second opening portion 50H may be an area overlapping the first area of the first opening portion 20H (see '20H' in FIG. 3). The second reflective portions 50PL and 50PR may be formed in an area overlapping the second area of the first opening portion 20H.

Referring to FIG. 8, the second reflective portion 50PL may be shaped like a curved surface extending in a left downward direction from an end of the second opening portion 50H to the first opening portion 20H (see '20H' in FIG. 3). The second reflective portion 50PR may be shaped like a curved surface extending in a right downward direction from an end of the second opening portion 50H to the first opening portion 20H (see '20H' in FIG. 3).

In FIG. 8, the second reflective portions 50PL and 50PR are formed on curved surfaces of the first light-transmitting buffer pattern layers 40PL and 40PR and the surfaces of the first reflective portions 20PL and 20PR. However, the present invention is not limited thereto, and the second reflective portions 50PL and 50PR formed on the surfaces of the first reflective portions 20PL and 20PR can be removed. That is, the second reflective portions 50PL and 50PR may be formed only on the curved surfaces of the first light-transmitting buffer pattern layers 40PL and 40PR.

The curvatures of the curved surfaces of the first light-transmitting buffer pattern layers 40PL and 40PR may be constant or variable. The curvatures of curved surfaces of the second reflective portions 50PL and 50PR may be determined by the curvatures of the curved surfaces of the first light-transmitting buffer pattern layers 40PL and 40PR. Therefore, the curvatures of the curved surfaces of the second reflective portions 50PL and 50PR may be constant or variable according to the curvatures of the curved surfaces of the first light-transmitting buffer pattern layers 40PL and 40PR.

FIG. 9 illustrates the path of light in the optical mask according to the first embodiment of the present invention.

Referring to FIG. 9, light L1 and L2 emitted from the light source disposed under the light-transmitting base substrate 10 transmits through the light-transmitting base substrate 10 to reach the first reflective pattern layer (20PL, 20PR, 20H). Of the light L1 and L2 reaching the first opening portion 20H, the light L1 incident upon the light-to-heat conversion pattern layer 30P is absorbed by the light-to-heat conversion layer 30P and converted into heat. The light L2 reaching the first opening portion 20H enters the remaining first opening portions 20HL and 20HR and the first light-transmitting buffer pattern layers 40PL and 40PR. Then, the light L2 is reflected by the second reflective pattern layer (50PL, 50PR) to enter an edge area of the light-to-heat conversion pattern layer 30P. The edge area of the light-to-heat conversion pattern layer 30P is an area adjacent to a boundary of each of the remaining first opening portions 20HL and 20HR. The temperature of the edge area of the light-to-heat conversion layer 30P is relatively lower than that of a central area of the light-to-heat conversion pattern layer 30P. This is because the heat generated from the light-to-heat conversion pattern layer 30P is dissipated to the air through thermal diffusion at the edge area.

Conventional methods coated the conversion layer entirely on a reflective layer. Therefore, the temperature of the conversion layer where the light is absorbed maintains high but not the other areas of the conversion layer. The converted thermal energy is eventually transferred to an edge of the conversion layer by thermal diffusion. Consequently, the temperature distribution in the entire conversion layer shows a Gaussian profile to render non-uniform the transfer of the organic layer to the device substrate.

The second reflective portions 50PL and 50PR concentrate light on the edge area of the light-to-heat conversion pattern layer 30P to compensate for a heat loss of the edge area. Therefore, the light-to-heat conversion pattern layer 30P of the optical mask according to the first embodiment of the present invention shows a temperature profile.

As described above, the curvatures of the curved surfaces of the second reflective portions 50PL and 50PR are variable. Therefore, more light can be irradiated to the edge area of the light-to-heat conversion layer 30P having a heat loss by changing the curvatures of the curved surfaces of the second reflective portions 50PL and 50PR.

An organic layer (not illustrated) can be transferred to a target substrate by using the optical mask of FIG. 8 as a transfer substrate. In this case, the organic layer (not illustrated) can be formed on the entire surface of the light-to-heat conversion pattern layer 30P.

The organic layer (not illustrated) may include organic material layers included in an organic light-emitting display device such as an organic light-emitting layer (EML), a hole injection layer (HIL), a hole transport layer (HTL), an electron injection layer (EIL), and an electron transport layer (ETL). In this case, the target substrate may be a thin-film transistor substrate of the organic light-emitting display device.

The organic layer (not illustrated) may be formed by using various methods including a wet method and a dry method. For examples, a spin coat method, a spray coat method, an inkjet method, a deep coat method, a cast method, a die coat method, a roll coat method, a blade coat method, a bar coat method, a gravure coat method, and a print method may be used as wet method, and a vacuum deposition method and a sputtering method may be used as dry method.

If the first light-transmitting buffer layer 40 is made of a material having superior light transmittance and high thermal conductivity, the first light-transmitting buffer layer 40 and the second reflective layer 50 having the dome structure of FIG. 7 may be used as a transfer substrate for transmitting the organic layer to the target substrate without being patterned. In this case, the organic layer may be formed on the entire surface of the second reflective layer 50. Since heat generated from the light-to-heat conversion pattern layer 30P should be uniformly transferred to the organic layer formed on the entire surface of the second reflective layer 50, the first light-transmitting buffer layer 40 may have a hemispherical dome structure.

FIGS. 10 through 15 illustrate a process of manufacturing an optical mask according to a second embodiment of the present invention.

A process of preparing a light-transmitting base substrate 10 and a process of forming a first reflective pattern layer (20PL, 20PR, 20H) on a surface of the light-transmitting base substrate 10 are the same as those described above with reference to FIGS. 1 through 3.

Figure 10:
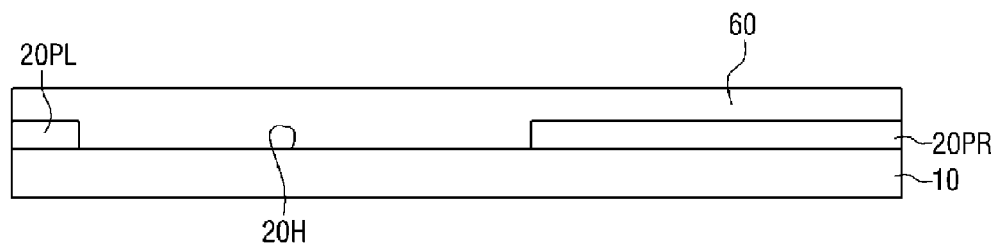
FIGS. 10 through 15 illustrate a process of manufacturing an optical mask according to a second embodiment of the present invention.

Referring to FIG. 10, after the formation of the first reflective pattern layer (20PL, 20PR, 20H) illustrated in FIG. 3, a second light-transmitting buffer layer 60 may be formed on surfaces of first reflective portions 20PL and 20PR and the surface of the light-transmitting base substrate 10 exposed through a first opening portion 20H.

FIG. 10 is different from FIG. 3 in that the second light-transmitting buffer layer 60 is formed on the surfaces of the first reflective portions 20PL and 20PR and the surface of the light-transmitting base substrate 10 exposed through the first opening portion 20H before the formation of a light-to-heat conversion pattern layer 30P.

The second light-transmitting buffer layer 60 prevents the diffusion of thermal energy generated by the light-to-heat conversion pattern layer 30P. The second light-transmitting buffer layer 60 may be made of a material having high light transmittance and low thermal conductivity. The second light-transmitting buffer layer 60 may be made of a material having lower thermal conductivity than that of the light-to-heat conversion pattern layer 30P.

For example, the thermal conductivity of the second light-transmitting buffer layer 60 may be 1.5 W/mK or less.

For example, the second light-transmitting buffer layer 60 may be made of any one of, but not limited to, titanium oxide, silicon oxide, silicon nitride oxide, zirconium oxide, silicon carbide, silicon oxide (SiOx), silicon nitride (SiNx), and an organic polymer. In addition, the second light-transmitting buffer layer 60 may be relatively thicker than the light-to-heat conversion pattern layer 30P. A topmost surface of the second light-transmitting buffer layer 60 may be flat.

Figure 11:
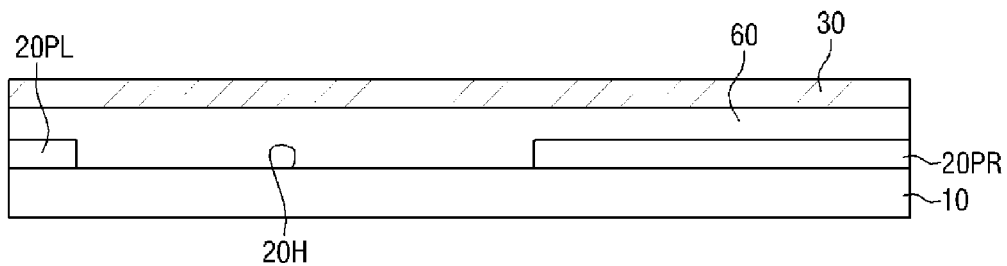

FIG. 11 illustrates a process of forming a light-to-heat conversion layer 30 on the surface of the second light-transmitting buffer layer 60.

FIG. 11 is different from FIG. 4 in that the light-to-heat conversion layer 30 in FIG. 11 is formed on the surface of the second light-transmitting buffer layer 60, whereas the light-to-heat conversion layer 30 in FIG. 4 is formed on the surfaces of the first reflective portions 20PL and 20PR and the surface of the light-transmitting base substrate 10 exposed through the first opening portion 20H.

Figure 12:
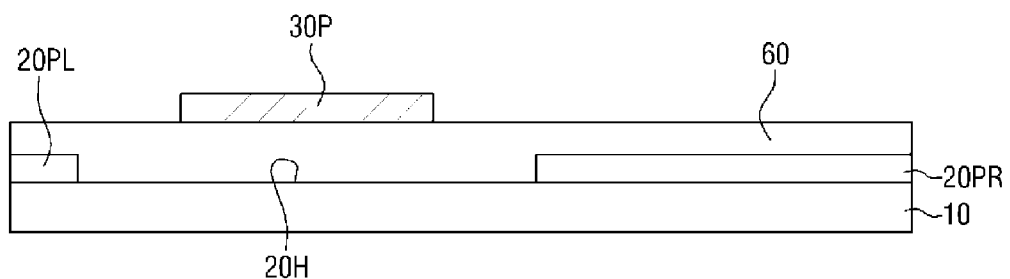

FIG. 12 illustrates a process of forming the light-to-heat conversion pattern layer 30P on the surface of the second light-transmitting buffer layer 60.

FIG. 12 is different from FIG. 5 in that the light-to-heat conversion pattern layer 30P in FIG. 12 is formed on the surface of the second light-transmitting buffer layer 60, whereas the light-to-heat conversion pattern layer 30P in FIG. 5 is formed on the surface of the light-transmitting base substrate 10 between the first reflective portions 20PL and 20PR.

Figure 13:
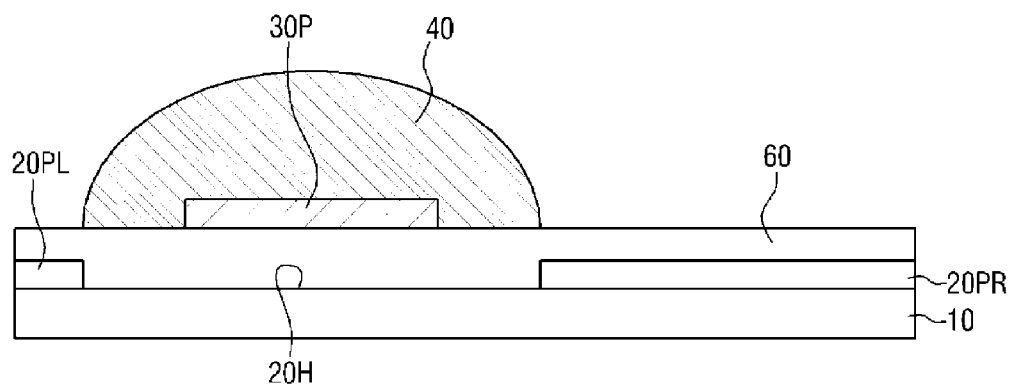

FIG. 13 illustrates a process of forming a dome-structured first buffer layer 40 on the surface of the second light-transmitting buffer layer 60 and a surface of the light-to-heat conversion pattern layer 30P.

FIG. 13 is different from FIG. 6 in that the dome-structured first buffer layer 40 in FIG. 13 is formed on the surface of the second light-transmitting buffer layer 60 and the surface of the light-to-heat conversion pattern layer 30P, whereas the dome-structured first buffer layer 40 in FIG. 6 is formed on the first surface of the light-transmitting base substrate 10 between the first reflective portions 20PL and 20PR and the surface of the light-to-heat conversion pattern layer 30P.

Figure 14:
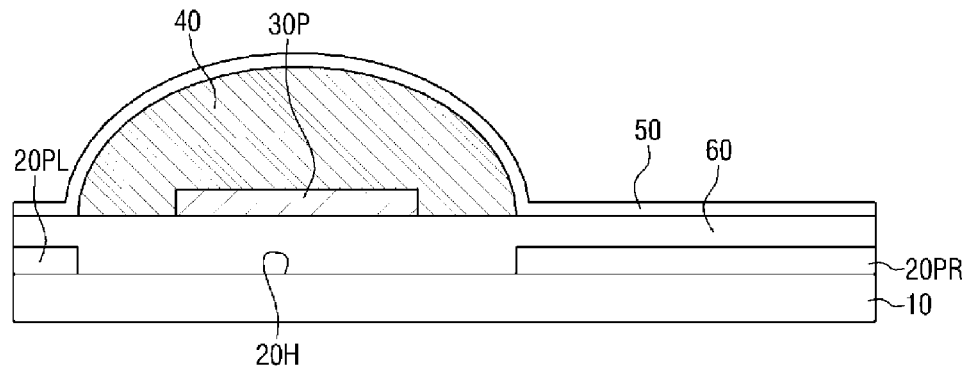

FIG. 14 illustrates a process of forming a second reflective layer 50 on the surface of the second light-transmitting buffer layer 60 and a surface of the dome-structured first buffer layer 40.

FIG. 14 is different from FIG. 7 in that the second reflective layer 50 in FIG. 14 is formed on the surface of the second light-transmitting buffer layer 60 and the surface of the dome-structured first buffer layer 40, whereas the second reflective layer 50 in FIG. 7 is formed on the surfaces of the first reflective portions 20PL and 20PR and the surface of the dome-structured first buffer layer 40 between the first reflective portions 20PL and 20PR.

Figure 15:
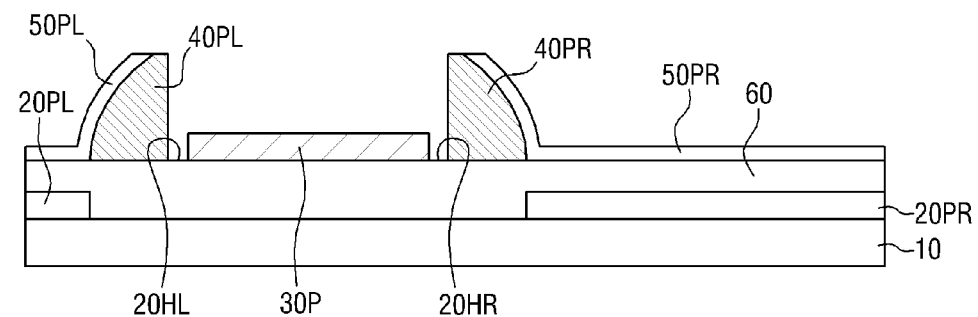

FIG. 15 illustrates a process of forming first buffer pattern layers 40PL and 40PR and second reflective portions 50PL and 50PR by partially removing the dome-structured first buffer layer 40 and the second reflective layer 50 in an area overlapping a first area.

FIG. 15 is different from FIG. 8 in that the light-to-heat conversion pattern layer 30P in FIG. 15 is formed on the surface of the second light-transmitting buffer layer 60 and exposed between the first buffer pattern layers 40PL and 40PR or between the second reflective portions 50PL and 50PR, whereas the light-to-heat conversion pattern layer 30P in FIG. 8 is formed on the first surface of the light-transmitting base substrate 10 and exposed between the first buffer pattern layers 40PL and 40PR or between the second reflective portions 50PL and 50PR.

Figure 16:
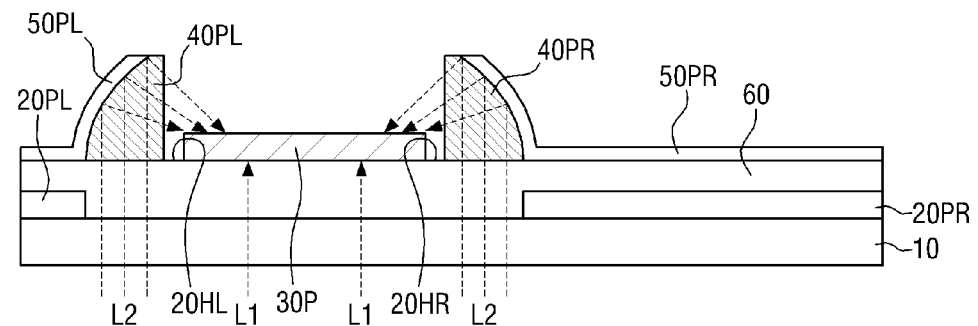
FIG. 16 illustrates the path of light in the optical mask according to the second embodiment of the present invention.

FIG. 16 is different from FIG. 9 in that light L1 and L2 emitted from a light source in FIG. 16 passes through the light-transmitting base substrate 10 to be absorbed by the light-to-heat conversion layer 30P via the second light-transmitting buffer layer 60 or passes through the first buffer pattern layers 40PL and 40PR formed on the surface of the second light-transmitting buffer layer 60 via the remaining first opening portions 20HL and 20HR and then is reflected by the second reflective portions 50PL and 50PR to enter the light-to-heat conversion pattern layer 30P formed on the surface of the second light-transmitting buffer layer 60, whereas the light L1 and L2 in FIG. 9 does not pass through the second light-transmitting buffer layer 60.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An optical mask, comprising:
    a light-transmitting base substrate;
    a first reflective pattern layer which is formed on the light-transmitting base substrate comprising a first opening portion transmitting light emitted from under the light-transmitting base substrate and a first reflective portion reflecting the light;
    a second reflective pattern layer which is formed over the first opening portion comprising a second opening portion overlapping a first area of the first opening portion and a second reflective portion overlapping a second area of the first opening portion excluding the first area; and
    a light-to-heat conversion pattern layer which is formed on the light-transmitting base substrate, being disposed in the first area of the first opening portion, absorbing incident light, and converting the absorbed light into heat.

2. The optical mask of claim 1, wherein the second reflective portion is shaped like a curved surface extending in a downward direction from an end of the second opening portion to the first opening portion, and all or part of light incident upon the curved surface are reflected to an edge area of the light-to-heat conversion layer.

3. The optical mask of claim 2, wherein the second reflective portion is shaped like a curved surface having a variable curvature.

4. The optical mask of claim 1, wherein the second reflective portion extends to an area overlapping the first reflective portion.

5. The optical mask of claim 1, further comprising a light-transmitting buffer layer which fills a space between the light-transmitting base substrate and the second reflective portion.

6. The optical mask of claim 1, further comprising:
    a light-transmitting buffer layer which is disposed between the first reflective pattern layer and the light-to-heat conversion pattern layer and covers the first reflective portion and the first opening portion.

7. The optical mask of claim 6, wherein the second reflective portion is shaped like a curved surface extending in a downward direction from an end of the second opening portion to the first opening portion, and all or part of light incident upon the curved surface are reflected to an edge area of the light-to-heat conversion pattern layer.

8. The optical mask of claim 7, wherein the second reflective portion is shaped like a curved surface having a variable curvature.

9. The optical mask of claim 6, wherein the second reflective portion extends to an area overlapping the first reflective portion.

10. The optical mask of claim 6, further comprising a light-transmitting buffer layer which fills a space between the light-transmitting base substrate and the second reflective portion.

11. The optical mask of claim 1, wherein the second reflective portion is made of one material selected from the group consisting of aluminum (Al), gold (Au), silver (Ag), platinum (Pt), copper (Cu), an aluminum-containing alloy, a silver-containing alloy, and indium oxide-tin oxide.

12. An optical mask, comprising:
    a light-transmitting base substrate;
    a first reflective pattern layer which is formed on the light-transmitting base substrate comprising a first opening portion transmitting light emitted from under the light-transmitting base substrate and a first reflective portion reflecting the light;
    a second reflective pattern layer which is comprised of a dome-structured second reflective portion formed over the first opening portion to cover the first opening portion; and
    a light-to-heat conversion pattern layer which is formed on the light-transmitting base substrate, being disposed in a first area of the first opening portion, absorbing incident light, and converting the absorbed light into heat.

13. The optical mask of claim 12, wherein the second reflective portion has a hemispherical dome structure, reflecting a part of the light incident upon a curved surface to the light-to-heat conversion pattern layer and transmitting a part of the light.

14. The optical mask of claim 12, wherein the second reflective portion extends to an area overlapping the first reflective portion.

15. The optical mask of clam 12, further comprising a light-transmitting buffer layer which fills a space between the light-transmitting base substrate and the second reflective portion.

16. The optical mask of claim 12, further comprising a light-transmitting buffer layer which is disposed between the first reflective pattern layer and the light-to-heat conversion pattern layer and covers the first reflective portion and the first opening portion.

17. The optical mask of claim 16, wherein the second reflective portion has a hemispherical dome structure, reflecting a part of the light incident upon the curved surface to the light-to-heat conversion pattern layer and transmitting a part of the light.

18. The optical mask of claim 17, wherein the second reflective portion extends to an area overlapping the first reflective portion.

19. The optical mask of claim 17, further comprising:
    a light-transmitting buffer layer which fills a space between the light-transmitting base substrate and the second reflective portion.

20. The optical mask of claim 12, wherein the second reflective portion is made of one material selected from the group consisting of aluminum (Al), gold (Au), silver (Ag), platinum (Pt), copper(Cu), an aluminum-containing alloy, a silver-containing alloy, and indium oxide-tin oxide.

* * * * *